US007129504B2

(12) United States Patent
Voss et al.

(10) Patent No.: US 7,129,504 B2
(45) Date of Patent: Oct. 31, 2006

(54) METHOD AND APPARATUS FOR GENERATION AND FREQUENCY TUNING OF MODULATED, HIGH CURRENT ELECTRON BEAMS

(75) Inventors: Donald E. Voss, Albuquerque, NM (US); Clifton C. Courtney, Cedar Crest, NM (US)

(73) Assignee: Voss Scientific, LLC, Albuquerque, NM (US)

( * ) Notice: Subject to any disclaimer, the term of this patent is extended or adjusted under 35 U.S.C. 154(b) by 60 days.

(21) Appl. No.: 10/855,828

(22) Filed: May 27, 2004

(65) Prior Publication Data

US 2004/0245933 A1 Dec. 9, 2004

Related U.S. Application Data

(60) Provisional application No. 60/475,727, filed on Jun. 4, 2003.

(51) Int. Cl.
*H01J 37/00* (2006.01)

(52) U.S. Cl. ................ 250/423 R; 330/45; 315/111.81

(58) Field of Classification Search ............... 315/5.33, 315/5.31, 5.11, 5.12, 111.81, 111.21; 313/103 R, 313/104; 330/42, 44, 45; 250/423 R, 396 R
See application file for complete search history.

(56) References Cited

U.S. PATENT DOCUMENTS

| | | | | |
|---|---|---|---|---|
| 4,345,220 A | | 8/1982 | Sullivan | 315/39 |
| 4,999,591 A | | 3/1991 | Koslover | 333/21 R |
| 5,101,168 A | | 3/1992 | Miller | 315/506 |
| 5,235,248 A | | 8/1993 | Clark | 315/5 |
| 6,163,112 A | * | 12/2000 | Ponard et al. | 315/5.47 |
| 6,642,657 B1 | * | 11/2003 | Mako et al. | 315/5.11 |

OTHER PUBLICATIONS

"Interchange of energy between an electron beam and an oscillating electric field," J. Marcum, Journal of Applied Physics, vol. 17, Jan. 1946.

"The Split Cavity Oscillator: a high power e-beam modulator and microwave source," B. Marder, et al., p. 312, IEEE Trans. Plasma Sci., vol. 20, 1992.

"Super RELTRON theory and experiments," R. Miller, et al., p. 332, IEEE Trans. Plasma Sci., vol. 20, 1992.

"Results of research on overcoming pulse shortening of GW class HPM sources," K. Hendricks, et al., p. 81, Digest of Technical Papers, International Workshop on High Power Microwave Generation and Pulse Shortening, Edinburgh, Scotland, 1997.

(Continued)

*Primary Examiner*—Tuyet Vo
*Assistant Examiner*—Ephrem Alemu
(74) *Attorney, Agent, or Firm*—Dennis F. Armijo

(57) ABSTRACT

Generating and frequency tuning of modulated high current electron beams and a specific efficient, high current, frequency-tunable device for generating intense radio frequency (RF), microwave electromagnetic fields in a rectangular waveguide. Current multiplication of a modulated seed electron beam is created by an energetic electron beam impacting a thin foil surface. The transmissive-electron-multiplier foils also mitigate both space charge expansion and improve beam propagation effects, by shorting of the radially directed electric field at the axial location of the foil(s). Foil thinness and intensity of the exit fields provide for a multiplication process occurring in a fraction of an RF period. Also included are both a self-excited microwave generator and an amplifier, using a temporally modulated laser to generate a modulated seed electron beam that is amplified. Methods to tune the oscillator are described that allow tunability over a full waveguide band.

22 Claims, 11 Drawing Sheets

OTHER PUBLICATIONS

"A wide-band inductive-output amplifier,"A. V. Haeff and L. S. Nergaard, Proc. of the IRE, vol. 28, pp. 126-130, Mar. 1940.

"The Klystrode—an unusual transmitting tube with potential for UHF," D. H. Preist and M. B. Shrader, Proc. of the IEEE, vol. 70, No. 11, pp. 1318-1325, Nov. 1982.

"Reflection and transmission secondary emission from silicon," R. Martinelli, Applied Physics Letters, pp. 313-314, vol. 17, No. 8, Oct. 15, 1970.

"The application of semiconductors with negative electron affinity surfaces to electron emission devices," Proc. of IEEE, vol. 62, No. 10, pp. 1339-1360, Oct. 1974.

"Image-field focusing of intense relativistic electron beams in vacuum," R. J. Adler, Particle Accelerators, vol. 12, pp. 39-44, 1982.

"International Workshop on High Power Microwave Generation and Pulse Shortening", K. Hendricks, Digest of Technical Papers, Jun. 10-12, 1997 Edinburgh Int. Conf. Cent., UK.

* cited by examiner

METHOD AND APPARATUS FOR GENERATION AND FREQUENCY TUNING OF MODULATED, HIGH CURRENT ELECTRON BEAMS

CROSS-REFERENCE TO RELATED APPLICATIONS

This application is based on U.S. Provisional Application Ser. No. 60/475,727, entitled High Power, Current Amplified, Tunable Post Accelerated Split Cavity Microwave Oscillator, filed on Jun. 4, 2003, the teachings of which are incorporated herein by reference.

BACKGROUND OF THE INVENTION

1. Field of the Invention (Technical Field)

The invention relates to microwave generation and more particularly to a resonant frequency (RF) generator that operates at low impedance, amplifies the current to increase the RF output power, allows tuning the frequency of the apparatus, and a method to allow operation as an amplifier 2. Background Art The efficient generation of microwaves from modulated electron beams requires electron beam velocity spectrums with low ratios of perpendicular energy to axial energy. Devices which violate this criteria pay a large price in terms of efficiency. For example, the virtual cathode oscillator (D. J. Sullivan, "High Power Microwave Generation using a Relativistic Electron Beam in a Waveguide Tube," U.S. Pat. No. 4,345,220, 17 Aug. 1982) has a very high ratio of E-perpendicular/E-parallel at the nominal axial location of the virtual cathode, potentially exceeding unity. Due to challenges in extracting usable RF power from such beams the practical efficiency of this device, a few percent typically, is poor, and no efficient means of harnessing the high modulated currents, often exceeding a few 10s kA at voltages of order 500 kV, has been developed.

A highly efficient device for modulating electron beams is known as the Split Cavity Oscillator, as described in U.S. Pat. No. 5,235,248. While this device has a high ratio of E-perpendicular/E-parallel at its exit port, this ratio is substantially reduced with acceleration, of the modulated electron beam to voltages of order MV. Post-acceleration of a spatially modulated electron beam, as a means to lock in a spatial modulation while substantially increasing axial kinetic energy and thus reducing E-perpendicular/E-parallel, has been used for many years. As far back as 1940 Haeff and Nergaard described post-acceleration in their Inductive Output Amplifier device, as shown in "A wide-band inductive-output amplifier," A. V. Haeff and L. S. Nergaard, Proc. of the IRE, vol. 28, pp. 126–130, March 1940. With post-acceleration, the SCO modulated beam kinetic energy can be converted to RF electromagnetic fields quite efficiently, exceeding 50%. However, virtual cathode formation limits the attainable current, due to space charge limitations in the modulating cavity of the device.

The operation of the prior art transit time oscillator (TTO), split cavity oscillator (SCO), and post accelerated split cavity oscillator (PASCO) are next briefly described in order to enable a distinction between previous techniques and the new methods described in the present invention.

The geometry of the TTO microwave oscillator is depicted in FIG. 1. Its operation relies on the interaction of a direct current (DC) electron beam 10 and the field of a cavity formed by a cylindrical pill box with perfectly conducting walls. The DC electron beam is often produced by a thermionic or field emission cathode 12. The geometry of the cavity is such that the time of flight 18 across the cavity 20 and the interaction of the beam 10 with the oscillating axial electric field associated with the cavity's axially symmetric mode 22 produce a spatially modulated electron beam 14. The spatially modulated electron beam 14 is converted to an electromagnetic wave 16; this conversion process is depicted symbolically in FIG. 1 since the details of the extraction/conversion process vary depending on the device and/or application. The operation of the TTO is described in detail in "The Split Cavity Oscillator: a high power e-beam modulator and microwave source," B. Marder, et al., pg. 312, IEEE Trans. Plasma Sci., vol. 20, 1992. This device is an extremely inefficient oscillator, a problem that is addressed by the SCO.

The geometry of the SCO microwave oscillator is depicted in FIG. 2. Its operation also relies on the interaction of a direct current (DC) electron beam 40 and the field of a cavity 41. In this case the cavity 42 is formed by a cylindrical pill box cavity with an intermediate electrically conducting septum 44 (placed exactly midway across the pill box) that extends part ways across the interior of the cavity 42, as shown in FIG. 2. Distinct from the operation of the TTO, the SCO operates according to a well known energy instability that exists between the electron beam 40 and the cavity 42, and an externally applied field is not required, as described in "The Split Cavity Oscillator: a high power e-beam modulator and microwave source," B. Marder, et al., pg. 312, IEEE Trans. Plasma Sci., vol. 20, 1992. Again, the DC electron beam 40 is often produced by a highly inefficient thermionic or field emission cathode 46. As with the TTO, the geometry of the SCO cavity is such that the time of flight across the cavity 48 and the interaction of the beam with the Pi-mode of the cavity's oscillating electric field cavity produce a spatially modulated electron beam 50. The SCO geometry and resulting electromagnetic field mode structure permits the axial length 48 of the cavity to be much shorter than the axial length of the TTO oscillator 18. Finally, the spatially modulated electron beam 50 is converted to an electromagnetic wave 52 as depicted symbolically in FIG. 2. Note that cathode 46 must produce the entire charge of electron beam 40, and consequently, operation at high powers requires that cathode 46 be capable of producing high current densities at high voltages. This often results in short cathode lifetimes, and pulse shortening due to gap closure caused by plasma drift across the anode-cathode gap, as shown in "Results of research on overcoming pulse shortening of GW class HPM sources," K. Hendricks, et al., pg. 81, Digest of Technical Papers, International Workshop on High Power Microwave Generation and Pulse Shortening, Edinburgh, Scotland, 1997. The main disadvantage of the SCO is the large axial velocity spread, and the substantial unwanted perpendicular velocities of the electrons that exit the cavity, leading to poor beam-to-RF power conversion efficiencies. The SCO is described in U.S. Pat. No. 5,235,248. However, this prior art patent describes an apparatus with a very specific geometry (cylindrical pill box with an electrically conducting septum placed exactly midway along the axial length of the cavity) that operates at a single frequency. No capability to adjust the frequency of operation of the device is disclosed or implied in the prior art patent.

The geometry of the PASCO microwave oscillator is depicted in FIG. 3. Its operation to produce a spatially modulated electron beam 60 is equivalent to the SCO described above. However, once the spatially modulated electron beam 60 is produced, the PASCO uses an accelerating screen or grid 62 at a high relative potential, typically 100's of kV or more, to accelerate the electron beam to relativistic velocities 64, i.e., close to the speed of light. This greatly reduces the relative axial velocity spread intrinsic to the SCO and represents a major improvement for potential high power and high efficiency operation. The relativistic spatially modulated electron beam 64 is then converted to an electromagnetic wave 66 as depicted in FIG. 3. This technique results in a more tightly velocity-modulated beam, while maintaining excellent spatial bunching allowing more efficient beam-to-RF extraction. The main disadvantages of the PASCO are: (1) the device has an inherent limitation on total current due to space charge depression in the modulating cavity, which ultimately can lead to virtual cathode formation, but at more modest current levels, reduces modulation efficiency; and (2) the PASCO is a fixed frequency device, in that there is no ability to tune its frequency while maintaining axisymmetry.

Post-acceleration of an electron beam for high power and high efficiency operation is described in U.S. Pat. No. 5,101,168. However, this patent describes methods that were well known prior to the patent's application date. As an example, post-acceleration of an electron beam was described by Haeff and Nergaard, "A wide-band inductive-output amplifier," A. V. Haeff and L. S. Nergaard, Proc. of the IRE, vol. 28, pp. 126–130, March 1940. Furthermore, post-acceleration of an electron beam was described by Preist and Shrader, "The Klystrode—an unusual transmitting tube with potential for UHF," D. H. Preist and M. B. Shrader, Proc. of the IEEE, vol. 70, no. 11, pp. 1318–1325, November 1982.

The present invention, a Current Amplified, Tunable, Post Accelerated, Modulator (CATPAM) apparatus uses techniques of the well known transit time oscillator (TTO) as described in "Interchange of energy between an electron beam and an oscillating electric field," J. Marcum, Journal of Applied Physics, vol. 17, January, 1946, a split cavity oscillator (SCO) shown in 'The Split Cavity Oscillator: a high power e-beam modulator and microwave source," B. Marder, et al., pg. 312, IEEE Trans. Plasma Sci., vol. 20, 1992, and the post accelerated split cavity oscillator (PASCO) (the PASCO is also known as the Reltron described in "Super RELTRON theory and experiments," R. Miller, et al., pg. 332, IEEE Trans. Plasma Sci., vol. 20, 1992, in conjunction with unique techniques to operate at low impedance, amplify the current to increase the RF output power, tune the frequency of the device, and a method to allow operation as an amplifier, as opposed to just an oscillator. The disclosed apparatus spatially modulates a direct current (DC) electron beam using instabilities associated with device geometry and transit time effects; or, it directly generates a spatially modulated electron beam using laser-induced electron emission. It then amplifies the resulting electron beam (current), accelerates the spatially modulated beam to relativistic velocities, and converts the kinetic energy of the spatially modulated relativistic electron beam to electromagnetic fields at microwave frequencies. In addition, methods are disclosed that allow the device to be tuned to a desired operating frequency while maintaining nominal axisymmetry. None of the prior art teaches or implies these novel features.

SUMMARY OF THE INVENTION (DISCLOSURE OF THE INVENTION)

Disclosed is a CATPAM RF generator device that allows for substantial levels of frequency tunability, without the need to break vacuum, while maintaining axisymmetry, and retains all the advantages of the PASCO devices as discussed in the Background Art section of the specification. Additionally, the use of a transmissive electron multiplier allows substantially higher current operation compared with PASCO, reducing the impedance and output power by the multiplication factor. Finally, the use of a RF-modulated laser to generate a seed current permits the use of the device as an amplifier, and greatly increases the output RF pulse width of the device.

A primary object of the present invention is to provide the ability to tune the frequency of the output microwave signal of the apparatus when it is operated as an oscillator.

Another object of the present invention is to provide a technique to amplify, or multiply, the electron beam current of the CATPAM, or other, device which creates a modulated electron beam. This method increases the microwave output power of the device, enhances the low impedance properties and efficiency of the device.

Another object of the present invention to provide a method for amplifying electron beams from an arbitrary device which has previously created a modulated electron beam current.

Yet another object of the present invention is the provision of a RF-modulated, laser-induced emission of electrons from a cathode.

An advantage of the present invention is that it increases the microwave output power of the apparatus, enhances the low impedance properties and efficiency of the apparatus.

Yet another advantage of the present invention is the allowance of the CATPAM to operate without a field emission cathode and without a RF modulator, and helps the CATPAM achieve greater operational efficiency in less volume and with less weight than otherwise would be the case.

Another advantage of the present invention is the ability of the CATPAM apparatus to operate as an amplifier.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS

Best Modes for Carrying Out the Invention

Disclosed is a Current Amplified, Tunable, Post Accelerated, Modulator (CATPAM) that is frequency tunable, high power capable, highly efficient in operation, and exhibits low impedance operation. The CATPAM can operate either as an oscillator or an amplifier, depending on the particular configuration.

Figure 1:
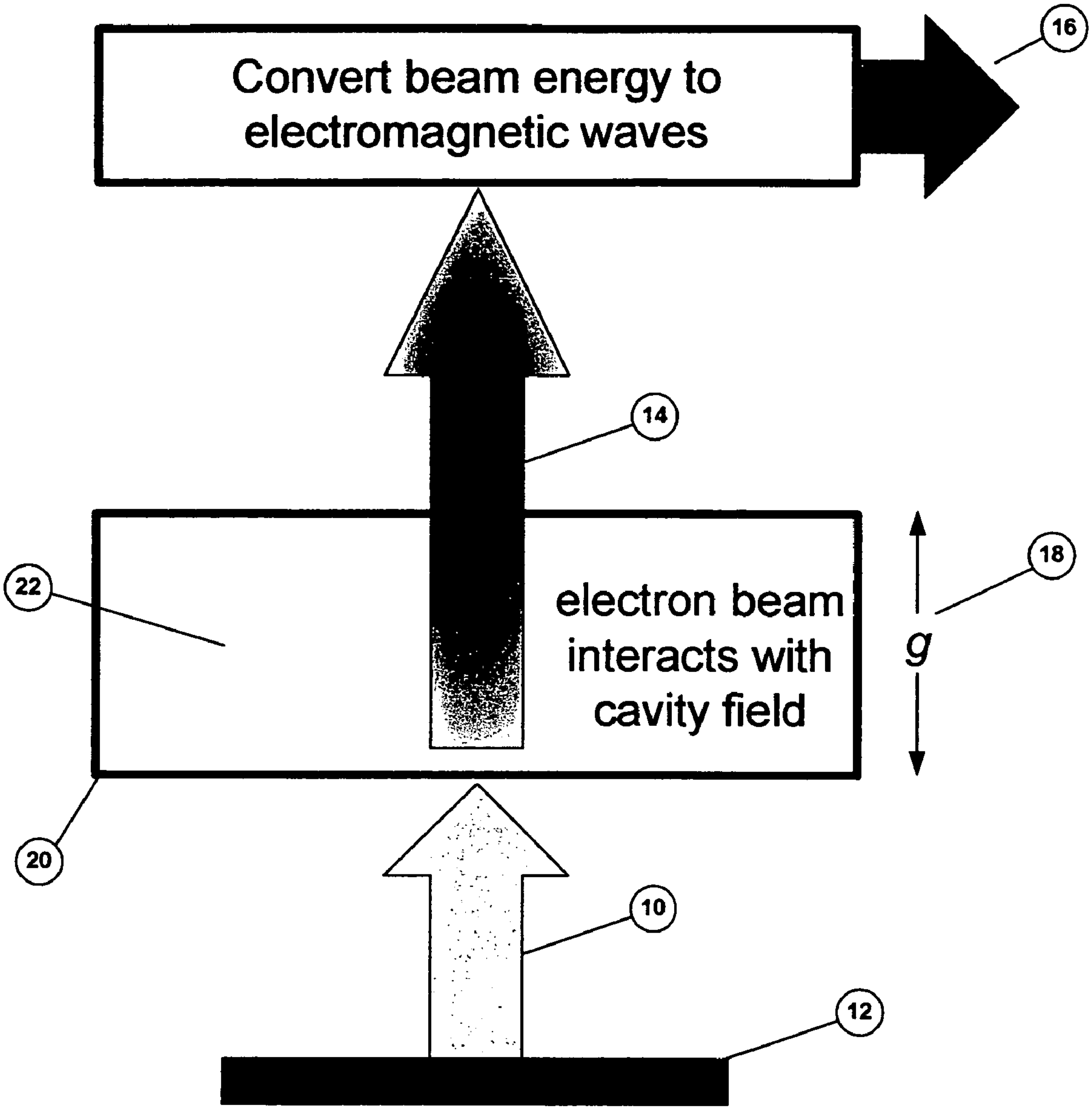
Fig. 1 Prior Art
FIG. 1 depicts the geometry of the prior art Transit Time Oscillator.
Figure 2:
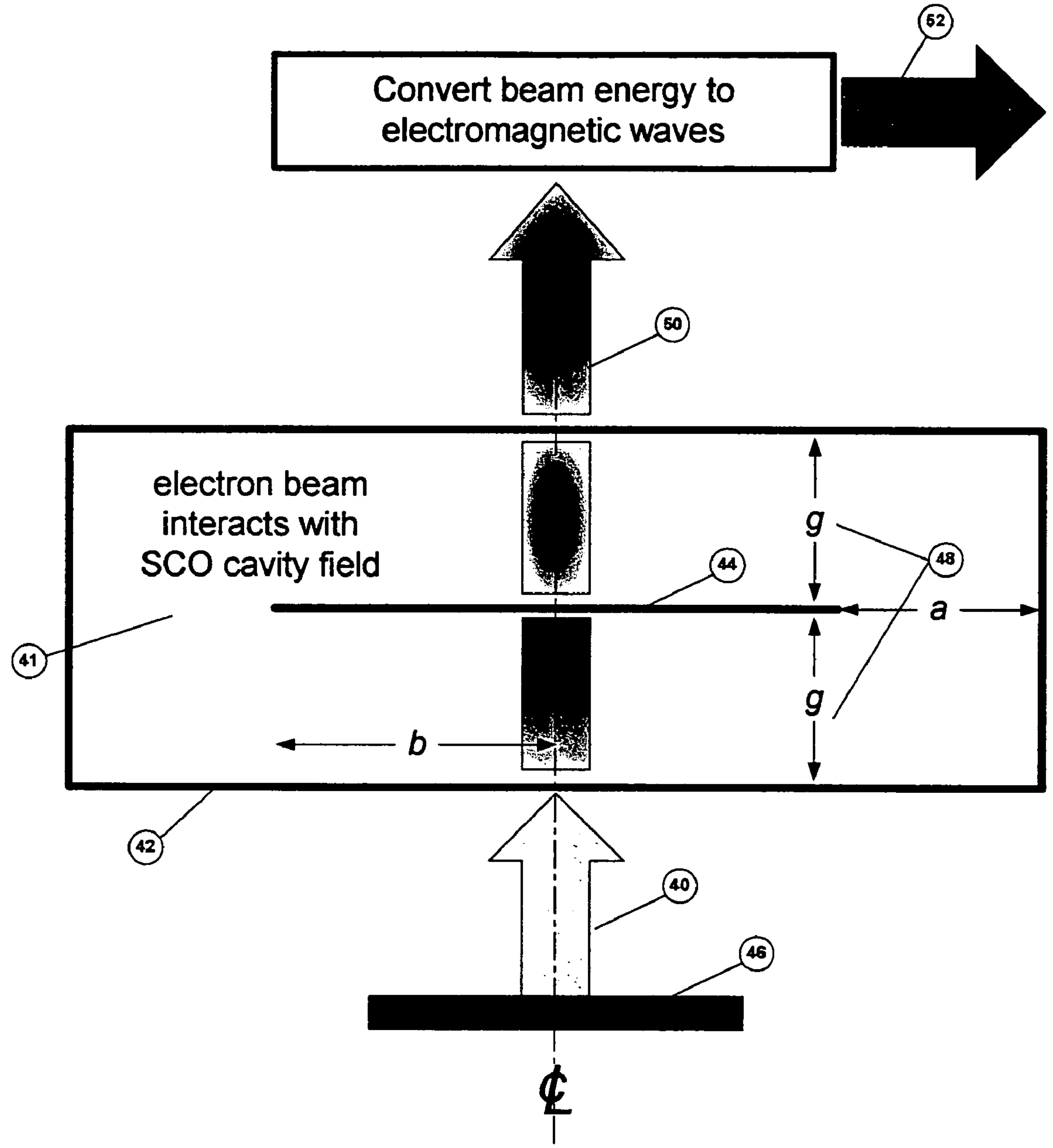
Fig. 2 Prior Art
FIG. 2 depicts the geometry of the prior art Split Cavity Oscillator.
Figure 3:
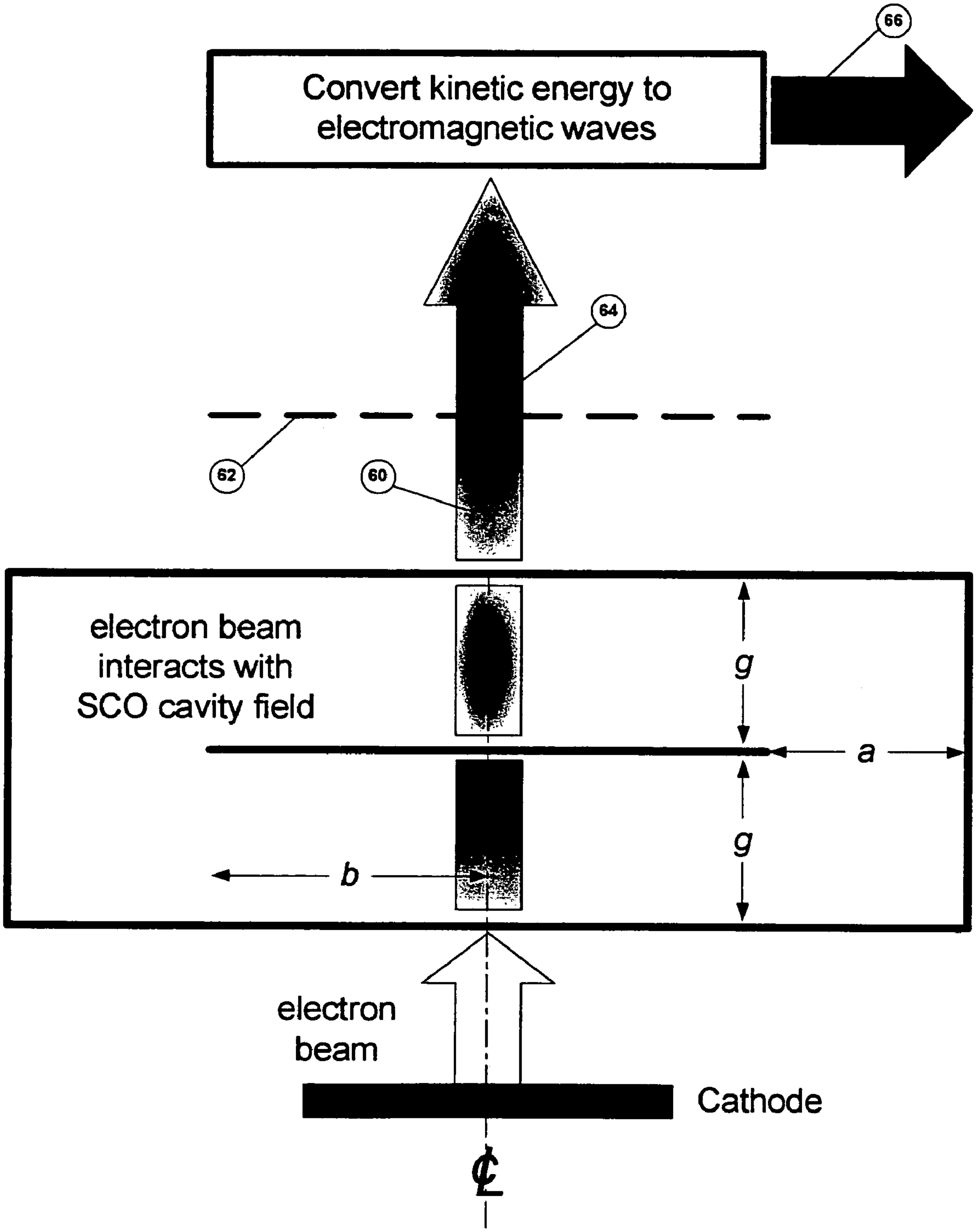
Fig. 3 Prior Art
FIG. 3 shows the geometry of the prior art Post Accelerated Split Cavity Oscillator.
Figure 4:
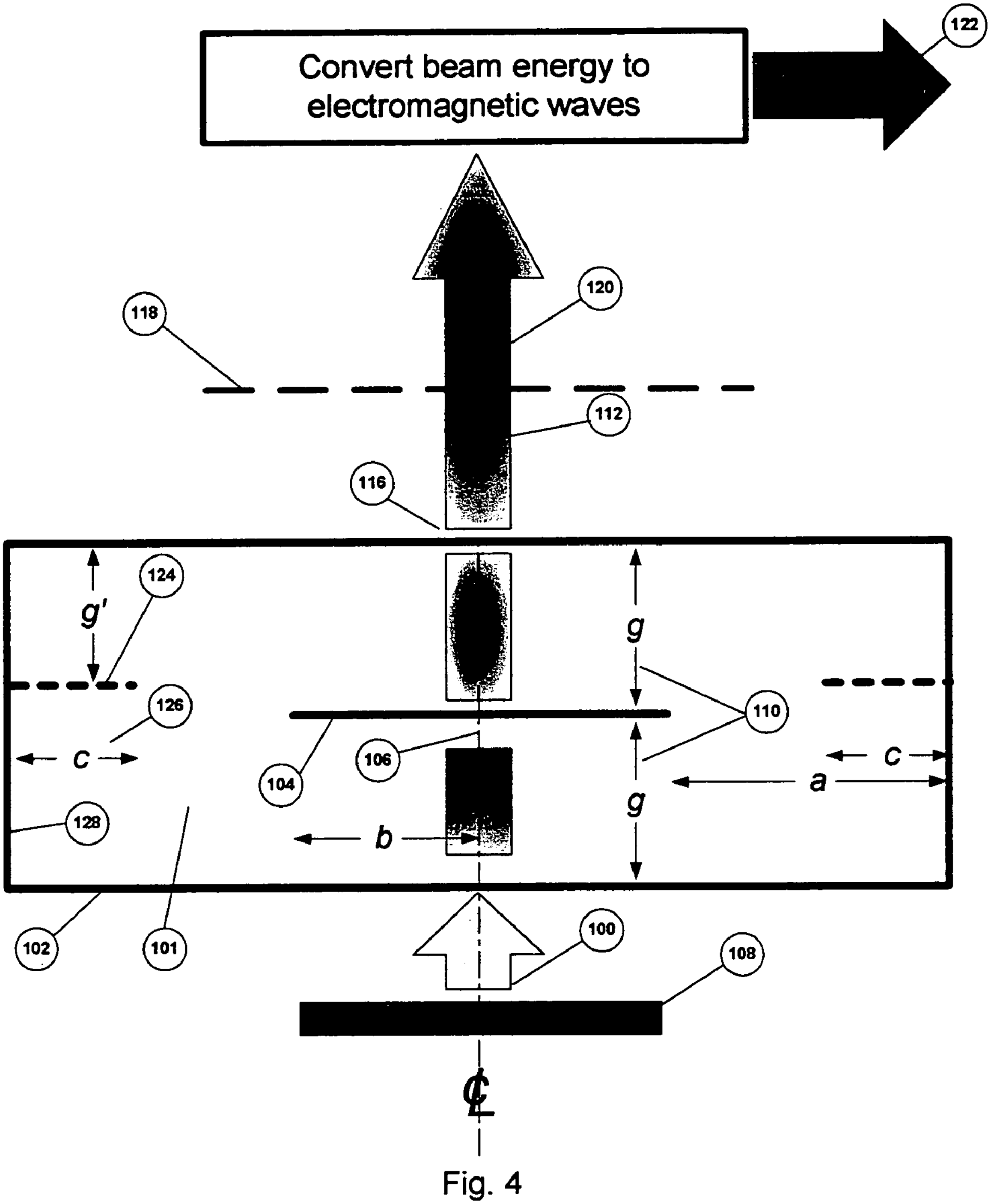
FIG. 4 illustrates the geometry of the preferred Current Amplified, Post Accelerated Modulator, with frequency tuning method no. 1.

The geometry of the CATPAM microwave oscillator, without current amplification, and with the first of four frequency tuning schemes, is depicted in FIG. 4 (please note that current amplification is not indicated in this figure). As shown, its operation relies on the interaction of a direct current (DC) electron beam 100 and the field of a closed rectangular pill box cavity 101 that contains an intermediate conducting septum 104 that extends partly across the interior centerline 106 of cavity 102. Again, DC electron beam 100 is often produced by a highly inefficient thermionic or field emission cathode 108. As with the TTO, the geometry of the modulating cavity 102 is such that the time of flight across the cavity 110 and the interaction of the beam 100 with the oscillating electric field 101 in cavity 102 produce a spatially modulated electron beam 112. The modulator geometry and resulting electromagnetic field mode structure promotes an instability that generates an oscillating electromagnetic field 101 at the frequency of the modulator's cavity mode. The interaction of the electron beam 100 with the cavity's electromagnetic field and the time of flight across the cavity 110 generate a spatially bunched electron beam 112 on the output side of the cavity 116. Spatially modulated electron beam 112 is subsequently accelerated by an accelerating grid 118 to a relativistic velocity producing a relativistic spatially modulated electron beam 120 and converted to an electromagnetic wave 122; this process is depicted symbolically in FIG. 4 since the details of the extraction/conversion process vary depending on the device and/or application. It is well known that the spatial modulation frequency of the modulator cavity is governed by the resonant frequency of the cavity. As shown in FIG. 4, included is a tuning annulus 124 for tuning (changing) the resonant frequency of cavity 102, and consequently tuning the spatial modulation of the electron beam 112. This, in turn, allows one to tune the output frequency of the electromagnetic signal that is ultimately extracted from the apparatus. The width of the tuning annulus 126, adjustable from outside of the apparatus (not shown) governs the resonant frequency of cavity 102 and the resulting electromagnetic signal that is ultimately extracted from the apparatus. Tuning annulus 124 is introduced into cavity 102 from the interior wall 128 of rectangular pill box cavity 102, as indicated in FIG. 4.

Figure 5:
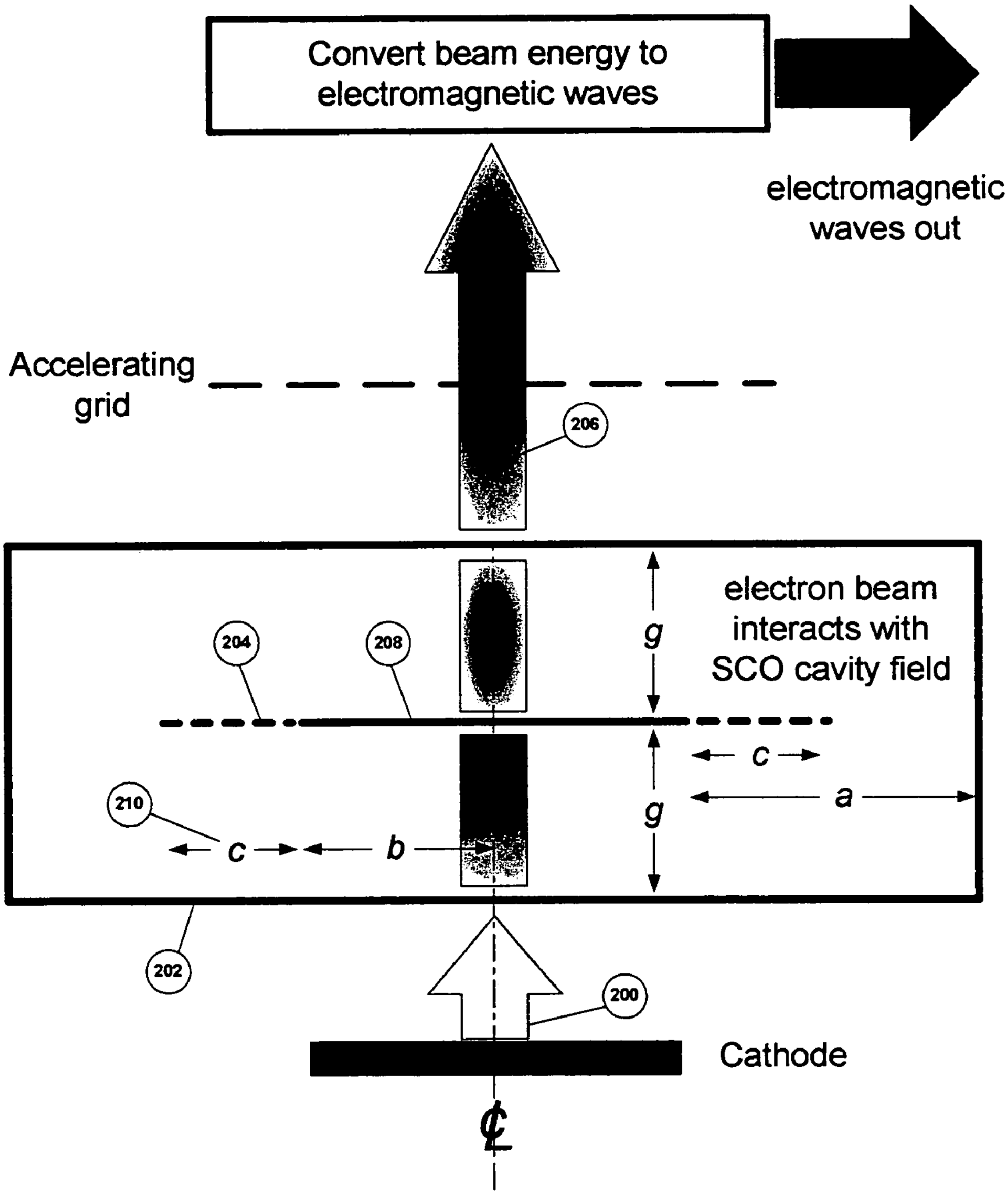
FIG. 5 depicts the geometry of the preferred Current Amplified, Post Accelerated Modulator, with frequency tuning method no. 2.

The geometry of the CATPAM microwave oscillator, without current amplification and the second of four frequency tuning schemes is depicted in FIG. 5. Its operation relies on the interaction of a direct current (DC) electron beam 200 and cavity 202 in the same manner as described above, though frequency tuning of the device is accomplished in a different manner. As shown in FIG. 5, a second embodiment for a tuning annulus 204 is shown to tune (change) the resonant frequency of the modulator's cavity 202, and consequently tune the spatial modulation of the electron beam 206. Tuning annulus 204 is introduced into cavity 202 from the center septum 208 of rectangular pill box cavity 202, as indicated in FIG. 5. Again, the width of the tuning annulus 210, adjustable from outside of the device (not shown in the figure) governs the resonant frequency of the cavity and the resulting electromagnetic signal that is ultimately extracted from the device.

Figure 6:
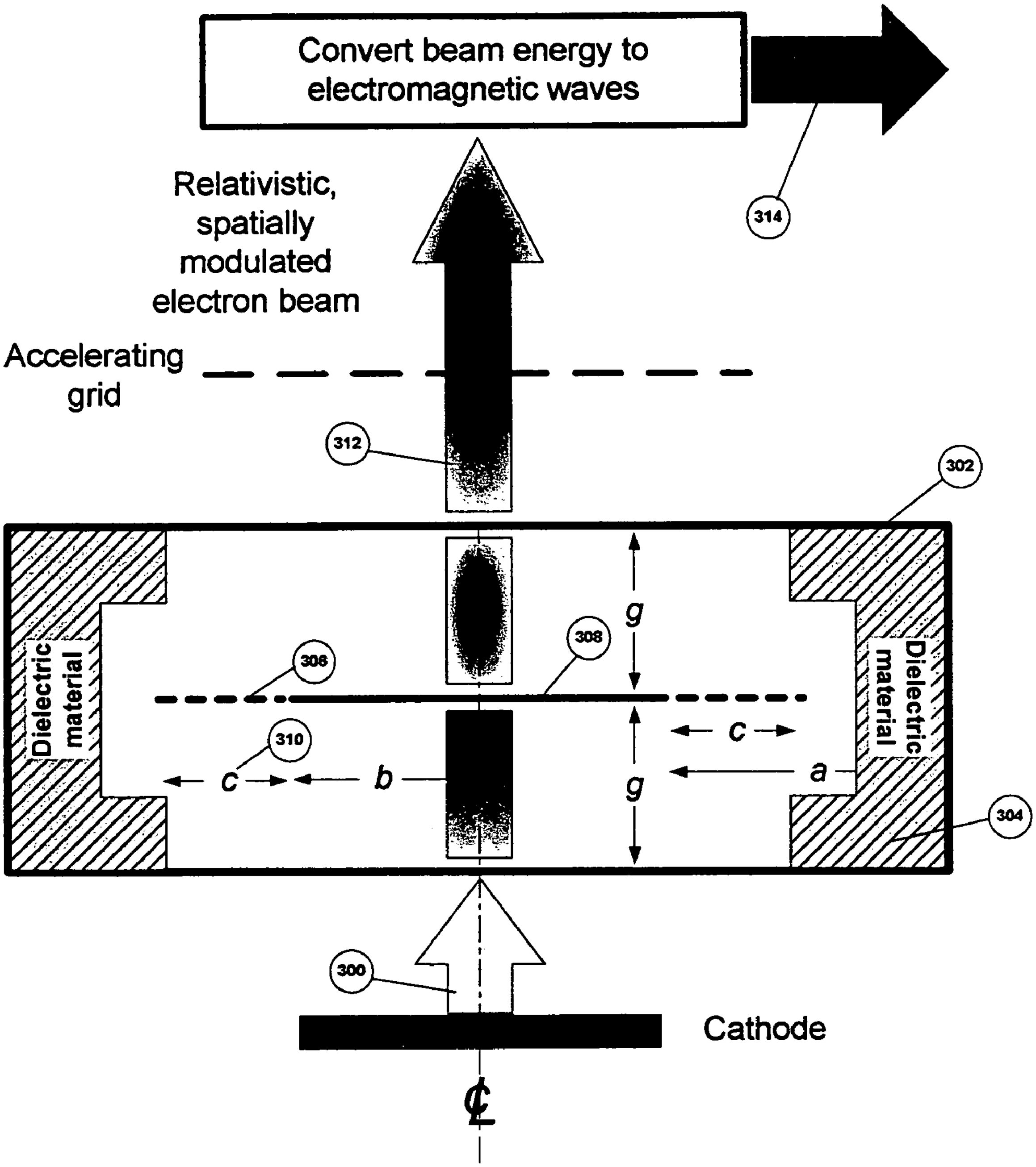
FIG. 6 gives details of the geometry of the preferred Current Amplified, Post Accelerated Modulator, with frequency tuning method no. 3.

The geometry of the CATPAM microwave oscillator, without current amplification and the third of four frequency tuning schemes is depicted in FIG. 6. Its operation relies on the interaction of a direct current (DC) electron beam 300 and cavity 302 in the same manner as described above, though frequency tuning of the device is accomplished in a different manner. As shown in FIG. 6, a dielectric material 304 with a relative dielectric constant greater than unity ($\epsilon_r>1$) is disposed in the internal volume of cavity 302. In an alternative embodiment, plasma which has a dielectric constant less than unity ($\epsilon_r<1$) can be disposed in portions of cavity 302 (not shown). The presence of dielectric material 304 depresses the resonant frequency of cavity 302, and in turn, reduces (or with plasma, increases) the frequency of the electromagnetic signal that is ultimately extracted from the apparatus. Also included is a tuning annulus 306 used to tune (change) the resonant frequency of cavity 302, and consequently tune the spatial modulation of electron beam 312. Tuning annulus 306 is introduced into cavity 302 from the center septum 308 of the rectangular pill box cavity 302, as indicated in FIG. 6. Again, the width of the tuning annulus 310, adjustable from outside of the device (not shown in the figure) governs the resonant frequency of cavity 302 and permits the tuning of the resulting electromagnetic signal 314 that is ultimately extracted from the apparatus.

Figure 7:
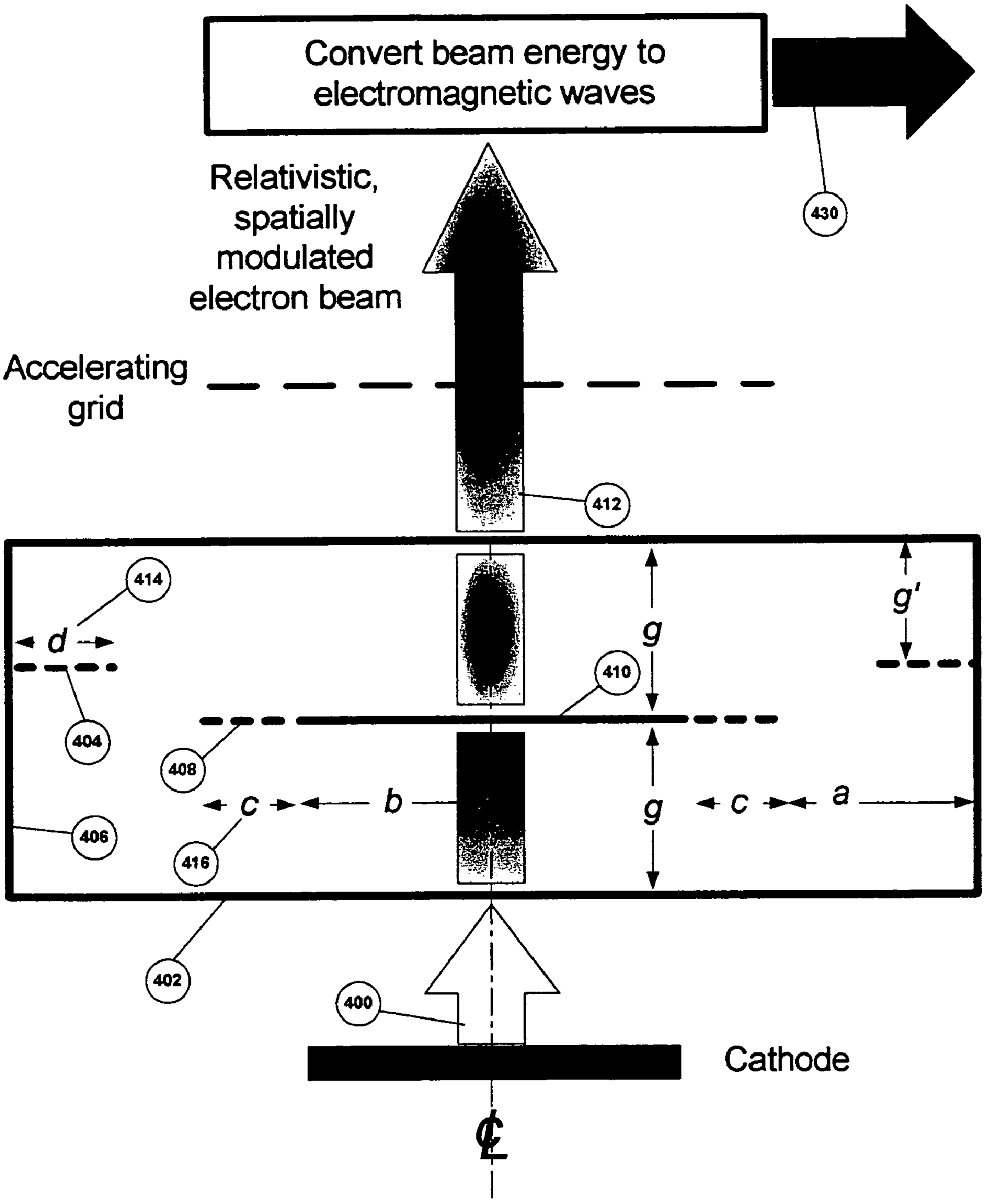
FIG. 7 depicts the geometry of the preferred Current Amplified, Post Accelerated Modulator, with frequency tuning method no. 4.

The geometry of the CATPAM microwave oscillator, without current amplification and the fourth of four frequency tuning schemes is depicted in FIG. 7. Its operation relies on the interaction of a direct current (DC) electron beam 400 and cavity 402 in the same manner as described above, though frequency tuning of the apparatus is accomplished in a different manner, in yet another alternative embodiment. As shown in FIG. 7, a tuning annulus 404 is provided that extends from the wall 406 of pill box cavity 402 and a second annulus 408 that is introduced into cavity 402 from a center septum 410 of rectangular pill box cavity 402. In this configuration, tuning (changing) the resonant frequency of the cavity, and consequently tuning the spatial modulation of electron beam 412 is accomplished. The widths 414, 416 of each tuning annulus 404, 408 work in concert to govern the resonant frequency of cavity 402 and permit the tuning of the resulting electromagnetic signal 430 that is ultimately extracted from the apparatus.

Figure 8:
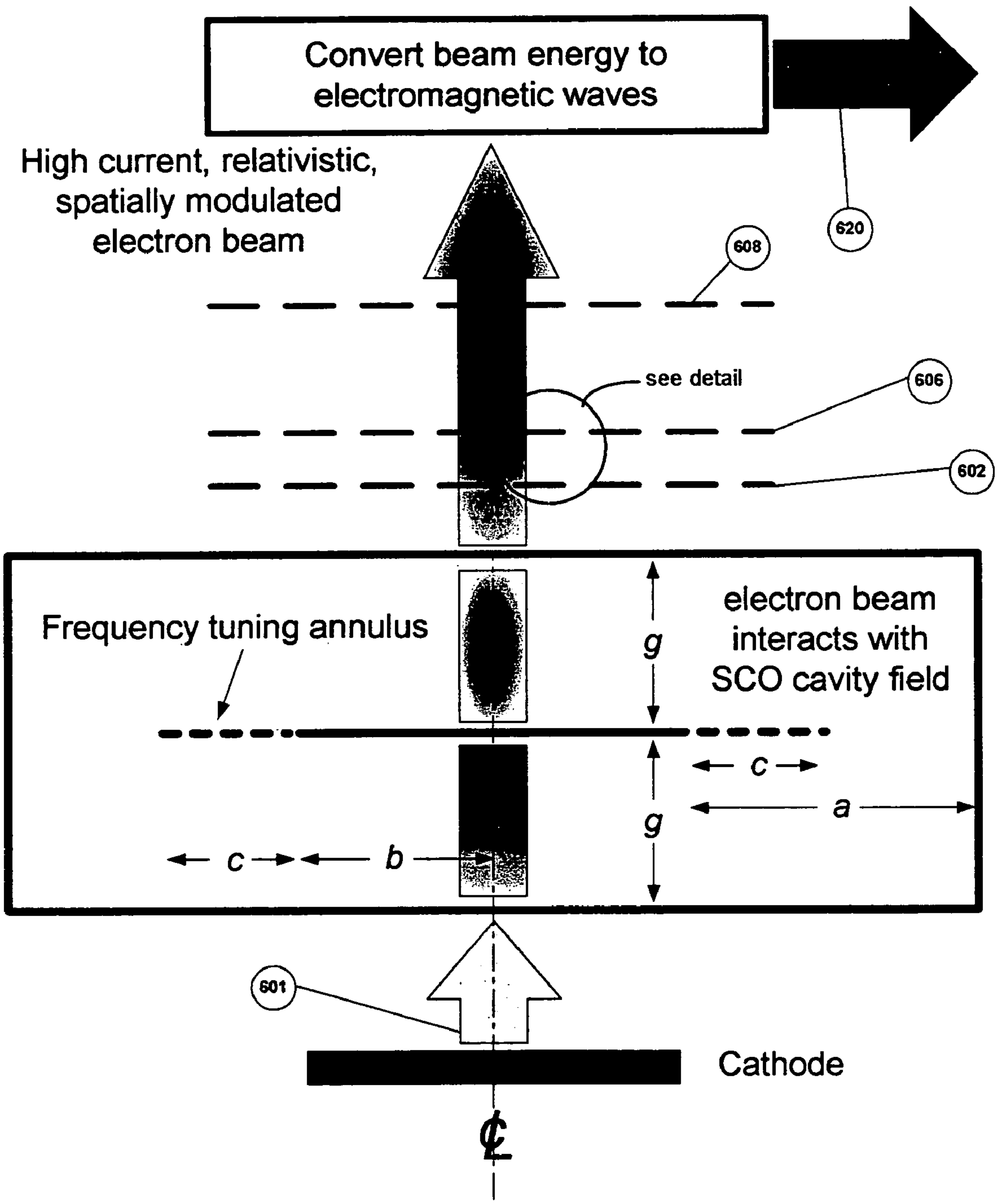
FIG. 8 illustrates the geometry of the preferred Current Amplified, Post Accelerated Modulator, with frequency tuning method no. 2.
Figure 9:
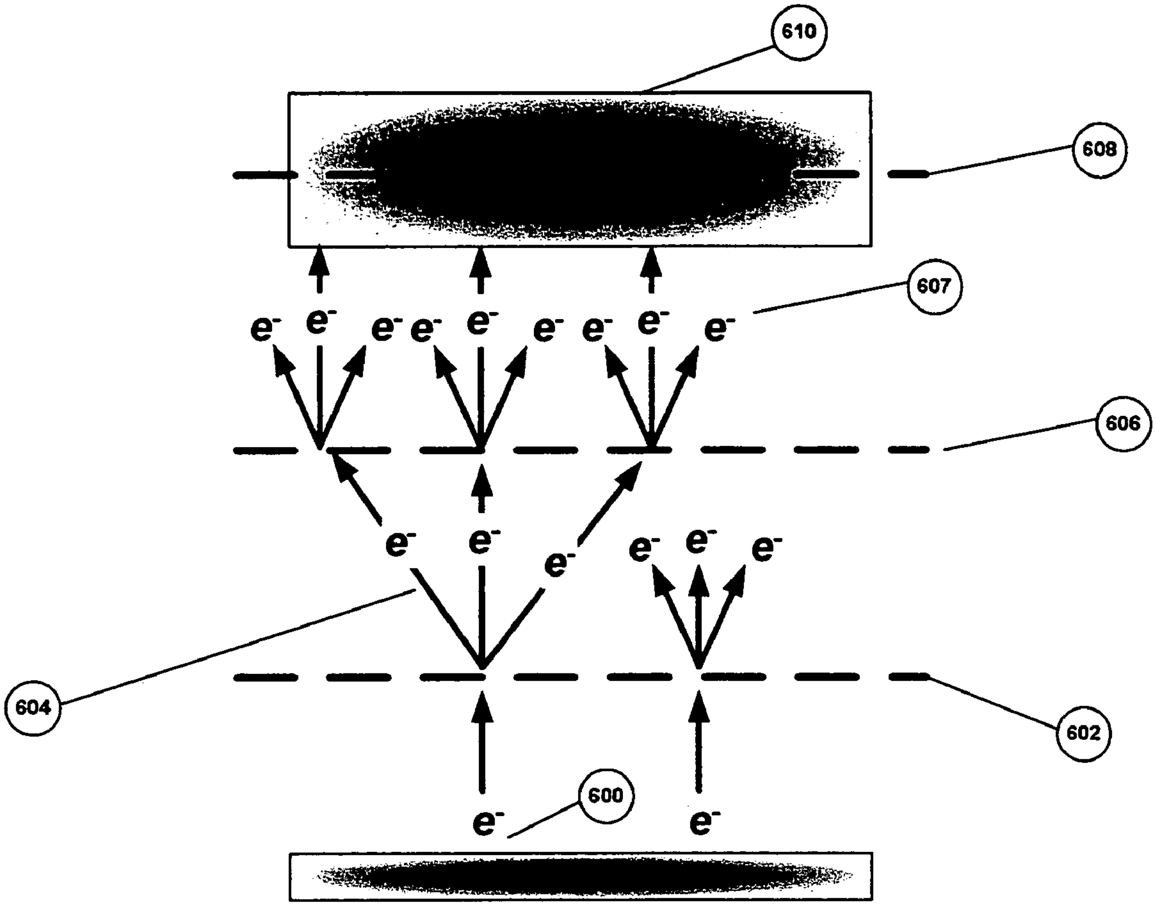
FIG. 9 shows the conceptual geometry of the current amplification process of the Current Amplified, Post Accelerated Modulator.

The geometry of the CATPAM microwave oscillator, with current amplification and the second of four frequency tuning schemes is depicted in FIG. 8. Note that current amplification is possible with any of the tuning schemes, as described above. The invention utilizes current multiplication of a seed beam 601, which is achieved by allowing an energetic electron beam to impact a thin foil surface 602 with high electric field on its downstream side. The foil is sufficiently thin and of such materials that the forward directed secondary electron cascade process, initiated by the seed beam, results in more electrons being ejected from the downstream surface than are incident on the front surface, per unit area, as described in "Reflection and transmission secondary emission from silicon," R. Martinelli, Applied Physics Letters, pp. 313–314, vol. 17, no. 8, 15 Oct. 1970 and "The application of semiconductors with negative electron affinity surfaces to electron emission devices," Proc. of IEEE, vol. 62, no. 10, pp. 1339–1360, October 1974. The output secondary electron cascade from the exit surface of the foil can be accelerated subsequently by an accelerating grid 608 for further multiplication in a similar manner with a similar foil 606, and so forth, yielding multiplication factors limited primarily by space charge and beam propagation effects, with the neglect of foil heating. The transmissive, electron multiplier foils as described are also beneficial in mitigating both space charge and beam propagation effects, due their shorting of the radially directed electric field as described in, "Image-field focusing of intense relativistic electron beams in vacuum," R. J. Adler, Particle Accelerators, vol. 12, pp. 39–44, 1982. Because the foil is sufficiently thin, and exit fields sufficiently intense, the multiplication process can occur on a small fraction of an RF period, even for frequencies as high as many GHz. Thus, any pre-existing modulation of the electron beam is well-preserved during the multiplication process. A large electric field on the final foil, provided by a large accelerating voltage 608, even to fractional or multi-MV levels, can produce high flowing powers in the electron beam; these can be converted into extracted microwave power 620 using a variety of traditional methods, including tuned cavities driving one or more rectangular waveguides, or transmission lines, for example. Without foil current enhancement, the apparatus is limited to modulated currents of approximately 1 kA, for voltages up to approximately 200 kV. With foil enhanced current multiplication, multiplicatively higher currents will be obtainable with CATPAM. The particular nature of electron multiplication is indicated in FIG. 9 in which it is shown that a single electron 600 strikes the transmissive electron multiplier 602, and three (for explanatory purposes) electrons are emitted on the other side 604. This process is repeated onto further transmissive electron multipliers 606 until the desired current level is achieved. The resulting high current, spatially modulated electron beam 607 is subsequently accelerated by the high voltage of the accelerating screen 608 which yields a high current, relativistic, spatially modulated electron beam 610. This configuration provides a method to operate a high current, high power microwave generator using an initial low value of seed current. This technique, in principle, allows for multiplicatively higher currents and current densities than would be available from PASCO or SCO devices. Both self-excited oscillator and amplifier configurations using the current multiplication method can be envisaged.

Figure 10:
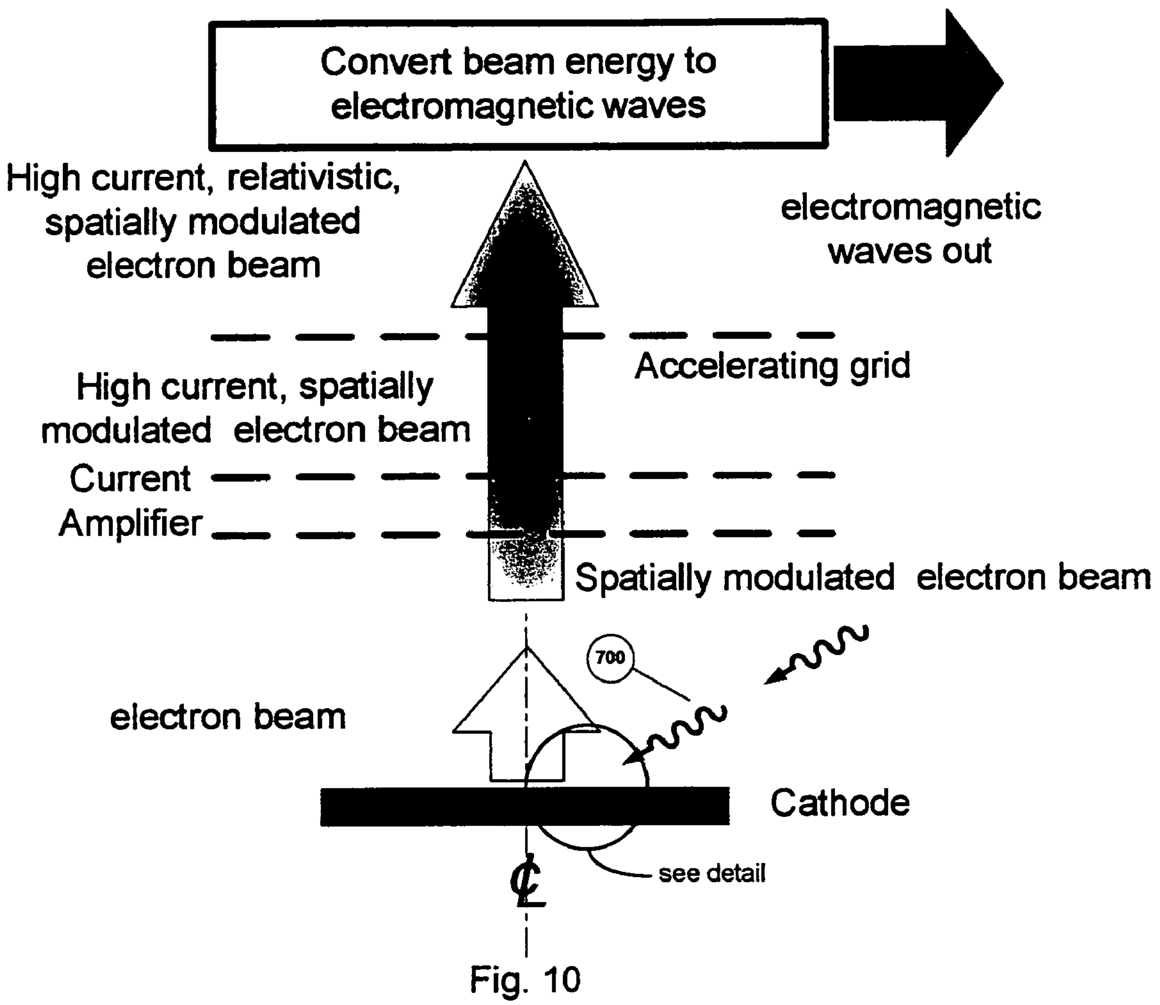
FIG. 10 depicts the geometry of the preferred Current Amplified, Tunable, Post-Accelerated Modulator, with laser-induced electron emission from the cathode illustrated. The laser is pulsed at an RF frequency, so the electrons that are emitted from the surface of the cathode constitute a spatially-modulated electron beam, obviating the need for a modulating cavity.
Figure 11:
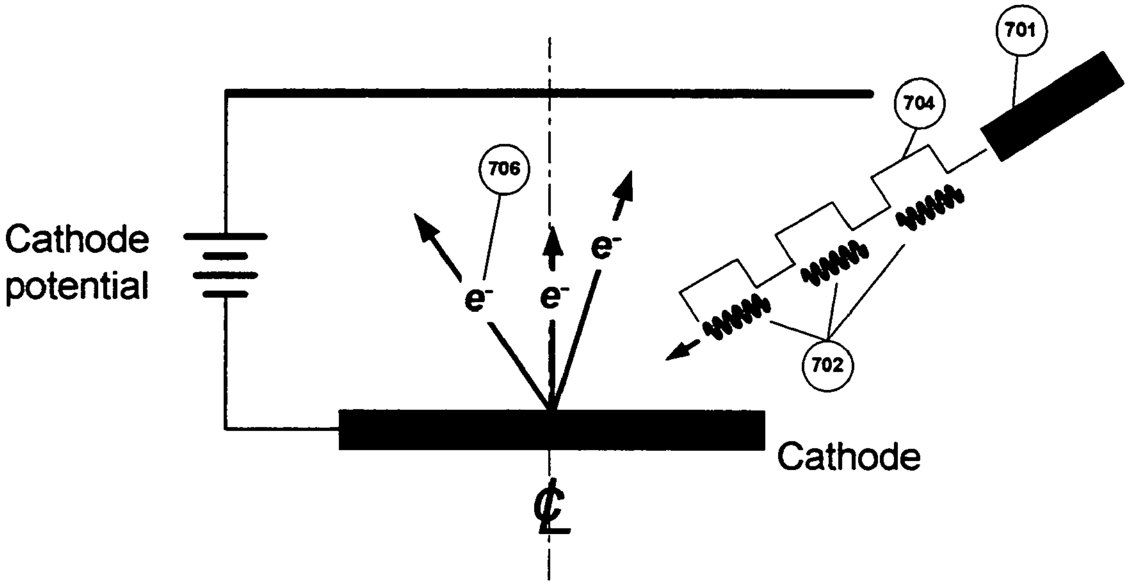
FIG. 11 graphically provides details of the laser-induced electron emission from the cathode of the Current Amplified, Tunable, Post-Accelerated Modulator. The laser is pulsed at an RF frequency, so the electrons that are emitted from the surface of the cathode constitute a spatially-modulated electron beam, obviating the need for a modulating cavity.

To eliminate the modulating cavity (thereby saving weight and volume) the scheme whereby a spatially modulated electron beam is directly produced is illustrated in FIG. 10. Note the absence of a modulating cavity in FIG. 10. There, an intense, temporally-modulated laser light 700, temporally modulated at RF frequencies, is depicted. A detail drawing of the laser-cathode interaction is depicted in FIG. 11. FIG. 11 shows a laser 701, which illuminates the cathode; laser light 702 is oscillating at light frequencies, but is modulated (turned on and off) on an RF time scale 704. The laser initiates the emission of a small number of electrons 706, a seed current. The small seed current generated in this fashion is subsequently amplified in the manner described previously. Traditional field emission cathode oscillators are typically limited to high power operation in the microsecond regime due to gap closure caused by unwanted plasma generated in the electron generation process. Since the CATPAM oscillator can operate with a small seed current that is subsequently multiplied as described above, the generation of high power RF pulses can occur over much longer times. Production of modulated electron beams on a time scale of order fractional to several microseconds is foreseen.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above, are hereby incorporated by reference.

What is claimed is:

1. A method for multiplying an amplitude of a modulated electron beam, the method comprising the steps of:

providing a foil, whereby the foil comprises a predetermined thickness and a predetermined first material; and impacting a seed low current modulated electron beam onto an upstream side of the foil causing a forward directed secondary cascading process resulting in ejecting more electrons from a downstream surface of the foil than are incident on a front surface of the foil, such that the ejected electrons maintain modulation characteristics of the seed low current modulated electron beam.

2. The method of claim 1 further comprising the step of tuning a modulating cavity comprising adjusting a resonant frequency of the modulating cavity to create predetermined temporal and spatial modulation characteristics of an output modulated electron beam.

3. The method of claim 2 wherein the step of tuning comprises providing a tuning annulus affixed to an interior wall of the modulating cavity.

4. The method of claim 2 wherein the step of tuning comprises providing a tuning annulus adjacent to a septum which is intermediate to entrance and exit planes of the modulating cavity.

5. The method of claim 2 wherein the step of tuning comprises providing a first tuning annulus adjacent to an intermediate septum of the modulating cavity and providing a second tuning annulus affixed to an interior wall of the modulating cavity.

6. The method of claim 2 wherein the step of tuning comprises providing a second material for altering a resonant frequency of the modulating cavity.

7. The method of claim 6 wherein the step of providing a second material comprises selecting a material from the group consisting of solid, liquid, gas, and plasma.

8. The method of claim 1 further comprising the step of providing a second foil for further multiplication of the electrons ejected from the down stream side of the first foil.

9. The method of claim 8 further comprising the step of providing a next foil for further multiplication of the electrons ejected from a downstream side of a previous foil.

10. The method of claim 1 further comprising the step of generating the seed electron beam comprising illuminating a cathode with a laser light.

11. The method of claim 10 wherein the step of illuminating a cathode comprises temporally modulating the laser light.

12. An apparatus for multiplying an amplitude of a modulated electron beam, the apparatus comprising:

a foil comprising a predetermined thickness and a predetermined first material wherein a modulated seed electron beam impacting on said foil causing a forward directed secondary cascading process resulting in ejecting more electrons from a downstream surface of the foil than are incident on a front surface of the foil wherein the ejected electrons comprise the multiplied modulated electron beam, wherein said multiplied modulated electron beam retains modulation properties of the seed electron beam.

13. The apparatus of claim 12 further comprising a means of tuning a modulating cavity to create predetermined temporal and spatial modulation characteristics of an output electron beam.

14. The apparatus of claim 13 wherein said means for tuning comprises a tuning annulus affixed to an interior wall of the modulating cavity.

15. The apparatus of claim 13 wherein said means for tuning comprises a tuning annulus adjacent to a septum which is intermediate to entrance and exit planes of the modulating cavity.

16. The apparatus of claim 13 wherein said means for tuning comprises a first tuning annulus adjacent to an intermediate septum of the modulating cavity and a second tuning annulus affixed to an interior wall of the modulating cavity.

17. The apparatus of claim 13 wherein means for tuning comprises a second material for altering a resonant frequency of the modulating cavity.

18. The apparatus of claim 17 wherein said second material comprises a member from the group consisting of solid, liquid, gas, and plasma.

19. The apparatus of claim 12 further comprising a second foil for further multiplication of ejected electrons from a downstream side of said first foil.

20. The apparatus of claim 19 further comprising a next foil for further multiplication of the multiplied modulated ejected electrons beam from a down stream side of a previous foil.

21. The apparatus of claim 12 further comprising a modulated laser light for illuminating a cathode for providing the modulated seed electron beam.

22. The apparatus of claim 21 wherein said modulated laser light for illuminating a cathode comprises a means for temporally modulating the electron current emitted from the cathode.

* * * * *